(12) United States Patent
Jou et al.

(10) Patent No.: US 7,755,143 B2
(45) Date of Patent: Jul. 13, 2010

(54) SEMICONDUCTOR DEVICE

(75) Inventors: Yeh-Ning Jou, Taipei County (TW); Geeng-Lih Lin, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 25 days.

(21) Appl. No.: 12/177,773

(22) Filed: Jul. 22, 2008

(65) Prior Publication Data
US 2009/0140370 A1 Jun. 4, 2009

(30) Foreign Application Priority Data
Nov. 30, 2007 (TW) .............................. 96145683 A

(51) Int. Cl.
*H01L 23/62* (2006.01)
(52) U.S. Cl. ..................... 257/355; 257/173; 257/357; 257/367
(58) Field of Classification Search ................. 257/355, 257/401, 356, 357, 367, 173
See application file for complete search history.

(56) References Cited

U.S. PATENT DOCUMENTS

2007/0007545 A1* 1/2007 Salcedo et al. .............. 257/127
2007/0120191 A1 5/2007 Litfin \* cited by examiner

*Primary Examiner*—Julio J Maldonado
(74) *Attorney, Agent, or Firm*—Quintero Law Office

(57) ABSTRACT

A semiconductor device is described. The semiconductor device comprises a protected device in a protected device area of a substrate. An electrostatic discharge power clamp device comprising an outer first guard ring and an inner second guard ring is in a guard ring area of the substrate, enclosing the protected device. The first guard ring comprises a first well region having a first conductive type. A first doped region having the first conductive type and a second doped region having a second conductive type are in the first well region. The second guard ring comprises a second well region having a second conductive type. A third doped region has the second conductive type in the second well region. An input/output device is in a periphery device area, coupled to the electrostatic discharge power clamp device.

24 Claims, 7 Drawing Sheets

SEMICONDUCTOR DEVICE

CROSS REFERENCE TO RELATED APPLICATIONS

This Application claims priority of Taiwan Patent Application No. 096145683, filed on Nov. 30, 2007, the entirety of which is incorporated by reference herein.

BACKGROUND OF THE INVENTION

1. Field of the Invention

The present invention relates to a semiconductor device, and in particular, to a semiconductor device comprising an electrostatic discharge power clamp device.

2. Description of the Related Art

Improving semiconductor device reliability has become very important due to improved semiconductor device scaling processes and critical requirements for dimensions and functions of consumer products. Semiconductor devices, however, may suffer from electrostatic discharge (ESD) damage during the processing, fabrication, assembly, delivery, testing and application of the semiconductor devices. Thus, ESD protection technology is required for semiconductor devices to prevent against possible ESD damage and insure sales quality. More specifically, ESD protection device design is required for semiconductor devices. For a system on a chip (SoC) using advanced semiconductor fabricating processes, the SoC may fail testing because of ESD damage to small scale devices in the SoC. Should additional ESD protection circuits be implemented, chip area would increase and high device density requirement would not be achieved.

Therefore, a semiconductor device with good device reliability and high device density is needed.

BRIEF SUMMARY OF INVENTION

To solve the above-described problems, a semiconductor device is provided. An exemplary embodiment of a semiconductor device comprises a substrate having a protected device area, a guard ring area and a periphery device area, wherein the substrate has a conductive first type. A protected device is in the protected device area. An electrostatic discharge power clamp device comprising an outer first guard ring and an inner second guard ring is in the guard ring area enclosing the protected device, wherein the first guard ring comprises a first well region having the first conductive type. A first doped region having the first conductive type and a second doped region having a second conductive type are in the first well region, adjacent to a surface of the substrate. The second guard ring comprises a second well region having the second conductive type. A third doped region having the second conductive type is in the second well region, adjacent to the surface of the substrate. An input/output device is in the periphery device area, coupled to the electrostatic discharge power clamp device.

Another exemplary embodiment for a semiconductor device comprises a p-type substrate having a protected device area, a guard ring area and a periphery device area. A protected device is in the protected device area. An electrostatic discharge power clamp device comprising an outer first guard ring and an inner second guard ring is in the guard ring area enclosing the protected device, wherein the first guard ring comprises an n-type well region. A first n-type heavily doped region and a first p-type heavily doped region are in the n-type well region, adjacent to a surface of the p-type substrate. The second guard ring comprises a p-type well region. A second p-type heavily doped region is in the p-type well region, adjacent to the surface of the p-type substrate. An input/output device is in the periphery device area, coupled to the electrostatic discharge power clamp device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 2c shows a cross section along line A-A' of FIG. 2a.

FIG. 3c shows a cross section along line A-A' of FIG. 3a.

DETAILED DESCRIPTION OF INVENTION

Figure 1:
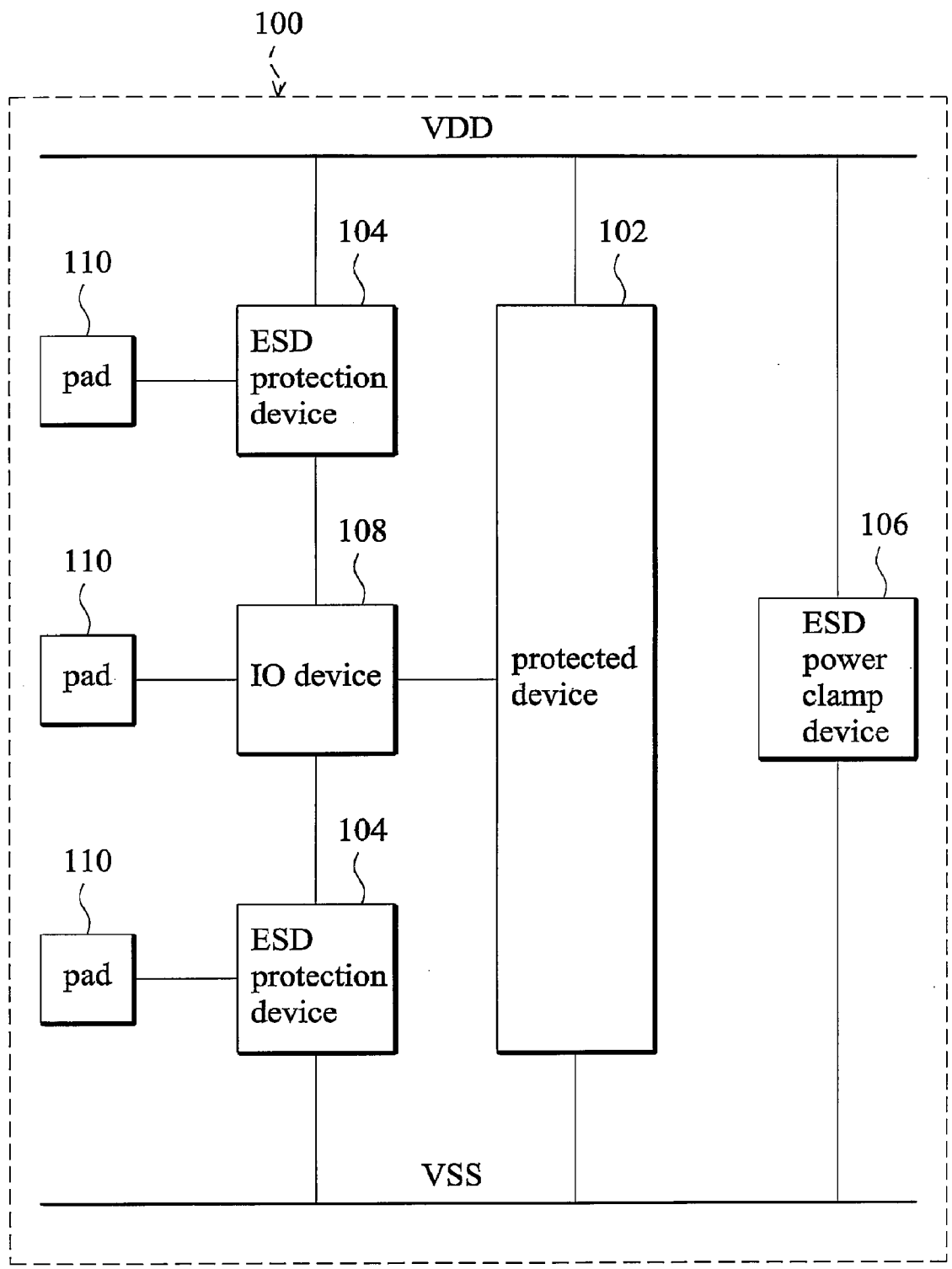
FIG. 1 shows a circuit diagram of a portion of an embodiment of a semiconductor device of the invention.

The following description is of a mode of carrying out the invention. This description is made for the purpose of illustrating the general principles of the invention and should not be taken in a limiting sense. The scope of the invention is determined by reference to the appended claims. Wherever possible, the same reference numbers are used in the drawings and the descriptions to refer the same or like parts.

FIG. 1 shows a circuit diagram of a portion of an embodiment of a semiconductor device 100 of the invention. The semiconductor device 100 comprises a protected device 102, an electrostatic discharge (ESD) protection device 104, an ESD power clamp device 106, an input/output (IO) device 108 and pads 110. As shown in FIG. 1, the ESD protection device 104 may be coupled to the protected device 102, the IO device, a high voltage power supply terminal VDD or a low voltage power supply terminal VSS. The ESD power clamp device 106 may be coupled to the protected device 102 and the ESD protection device 104 through the high voltage power supply terminal VDD or the low voltage power supply terminal VSS. The IO device 108 is coupled to the pad 110.

The protected device 102 may comprise core devices or other devices needed to be protected by the ESD protection device 104. In one embodiment, the ESD protection device 104 may comprise diodes, transistors or combinations thereof. The ESD power clamp device 106 may be used to limit power of the ESD protection device 104. The IO device 108 may be used to supply power or provide signals to the protected device 102. The IO device 108 may comprise metal-oxide-semiconductor field-effect transistors (MOS transistors), erasable programmable read-only memories (EPROMs), electrically erasable programmable read-only memories (EEPROMs), static random access memories (SRAMs), dynamic random access memories (DRAMs), single electron transistors (SETs), diodes, capacitors, inductors or combinations thereof.

Figure 2A:
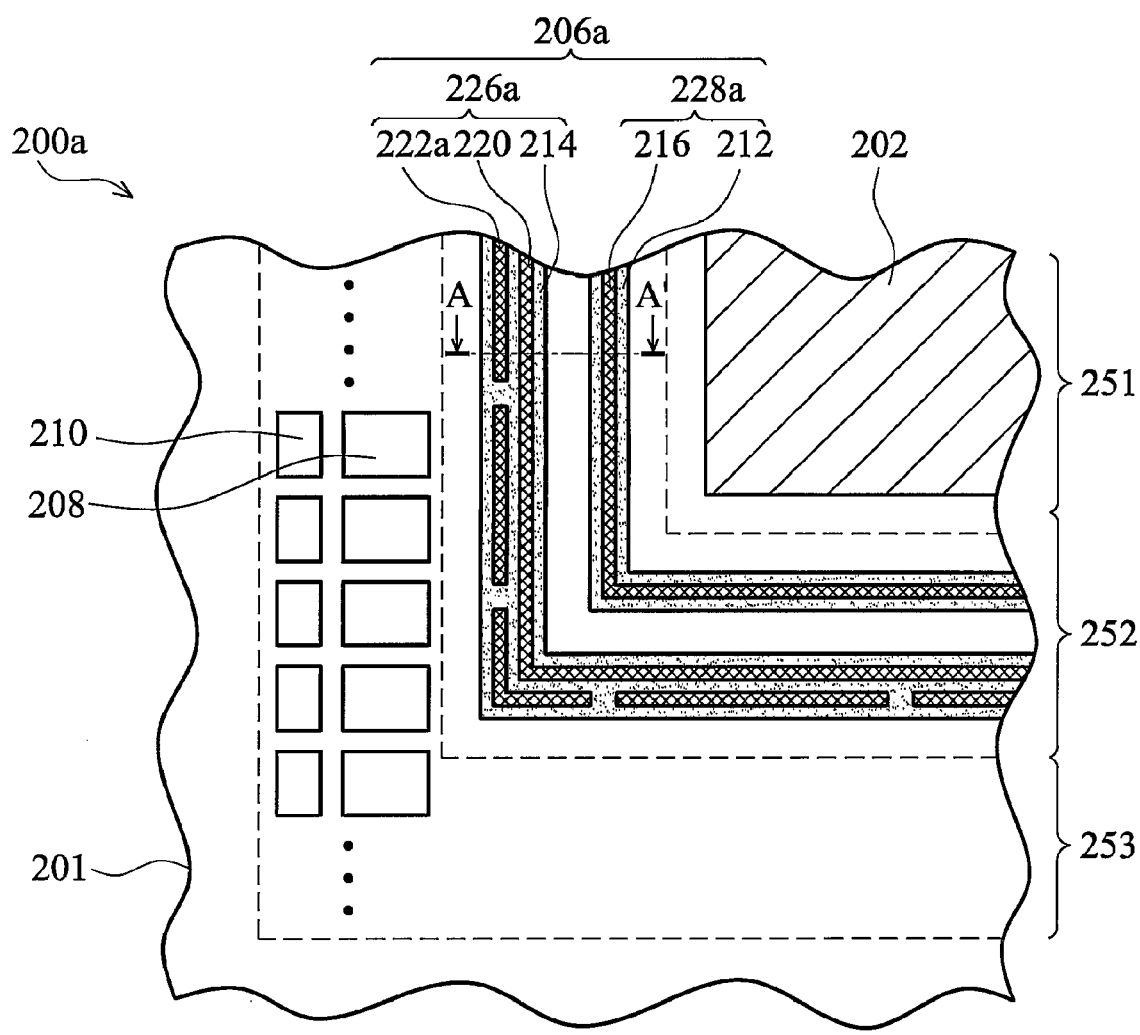
FIGS. 2a and 2b show circuit layout diagrams of a portion of embodiments of a semiconductor device of the invention.

FIGS. 2a, 2b, 3a and 3b illustrate circuit layout diagrams of a portion of various embodiments of a semiconductor device of the invention, showing top views of a portion of various embodiments of a semiconductor device of the invention. FIG. 2a shows a circuit layout diagram 200a of a portion of an embodiment of a semiconductor device of the invention. The circuit layout diagram 200a may have three areas comprising a protected device area 251, a guard ring area 252 and a periphery device area 253. A protected device 202 is disposed in the protected device area 251. Input/output (IO) devices 208 and pads 210 are disposed in the periphery device area 253. An electrostatic discharge (ESD) power clamp device 206a is disposed in the guard ring area 252, substantially enclosing the protected device 202. As shown in FIG. 2a, the protected device 202, the ESD power clamp device 206a and the IO devices 208 are disposed on the substrate 201. The ESD power clamp device 206a is coupled to the protected device 202 and the IO devices 208. The pads 210 are coupled to the IO devices 208. An alternative embodiment may further comprise an electrostatic discharge protection (ESD) device (not shown) in the periphery device area 253, coupled to the IO devices 208 and the ESD power clamp device 206a.

The substrate 201 may comprise silicon. In alternative embodiments, SiGe, bulk semiconductor, strained semiconductor, compound semiconductor, silicon on insulator (SOI), and other commonly used semiconductor substrates can be used for the substrate 201. The substrate 201 may have a desired conductive type by implanting p-type or n-type impurities. In this embodiment, the substrate 201 may be p-type.

As shown in FIG. 2a, the ESD power clamp device 206a may comprise an outer first guard ring 226a and an inner second guard ring 228a. The first guard ring 226a may comprise a first well region 214, a first doped region 220 and a second doped region 222a. In one embodiment, the first well region 214 may have a conductive type the same as the substrate 201. For example, the first well region 214 may serve as a p-type well region 214. The first doped region 220 and the second doped region 222a are in the first well region 214, adjacent to a surface of the substrate 201. As shown in FIG. 2a, the second doped region 222a may be a plurality of discontinuous doped regions isolated from each other by a plurality of shallow trench isolation (STI) features. In one embodiment, the first doped region 220 and the second doped region 222a may substantially and respectively enclose the protected device 202 and are parallel with each other. The first doped region 220 and the second doped region 222a may have different conductive types from each other. Impurity concentrations of the first doped region 220 and the second doped region 222a may be larger than that of the first well region 214. Therefore, if the first doped region 220 serves as an n-type heavily (n+) doped region 220, than the second doped region 222a would serve as a p-type heavily (p+) doped region 222a. Alternatively, if the first doped region 220 serves as a p-type heavily (p+) doped region 220, than the second doped region 222a would serve as an n-type heavily (n+) doped region 222a. Additionally, the second guard ring 228a may comprise a second well region 212 and a third doped region 216. In one embodiment, the second well region 212 may have a conductive type different from the substrate 201. For example, the second well region 212 may serve as an n-type well region 212. Meanwhile, the third doped region 216 is in the second well region 212, adjacent to the surface of the substrate 201. As shown in FIG. 2a, the third doped region 216 may substantially enclose the protected device 202, parallel to the first doped region 220 and the second doped region 222a. The third doped region 216 may be isolated from the first doped region 220 or the second doped region 222a by a plurality of STI features. The third doped region 216 may have a conductive type which is the same as the second well region 212. And the third doped region 216 may have an impurity concentration larger than that of the second well region 212. In this embodiment, the third doped region 216 may serve as an n-type heavily dope (n+) region 216.

Figure 2B:
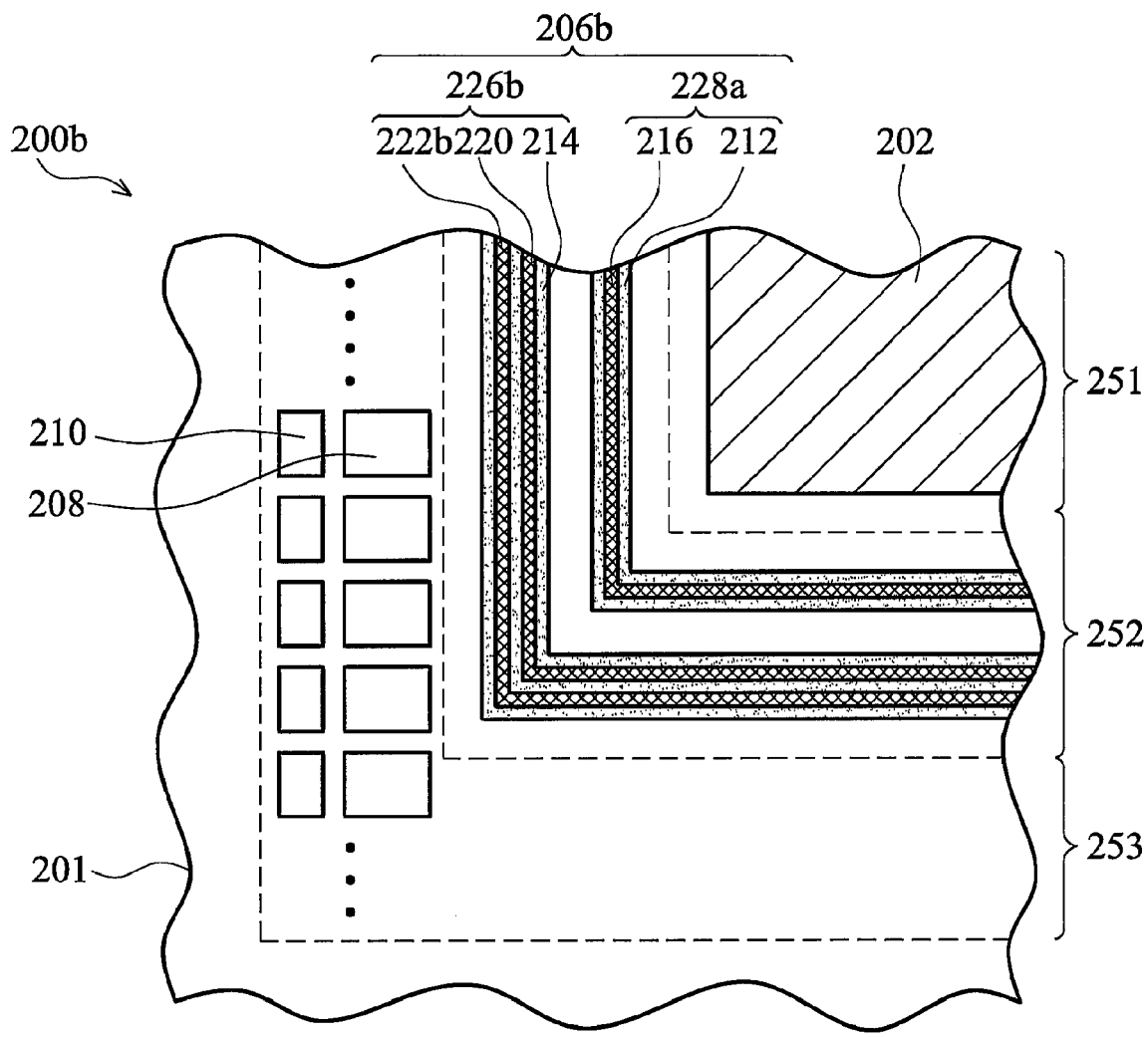

FIG. 2b shows a circuit layout diagram 200b of a portion of another embodiment of a semiconductor device of the invention, showing a top view of a portion of another embodiment of a semiconductor device of the invention. As shown in FIG. 2b, a second doped region 222b of an ESD power clamp device 206b is a continuous doped region.

Figure 2C:
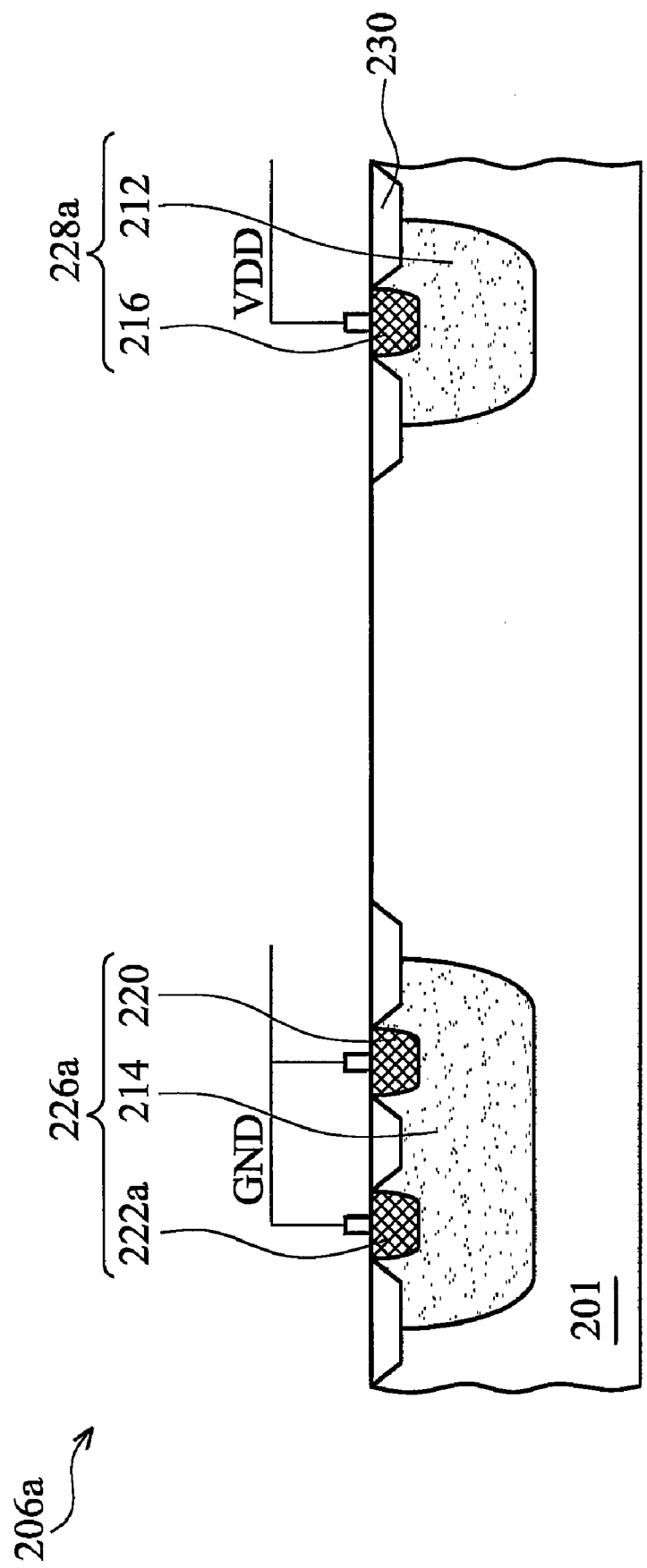

FIG. 2c shows a cross section of the ESD power clamp device 206a. As shown in FIG. 2c, the first well region 214 and the second well region 212 are isolated form each other by STI features 230. Similarly, the first doped region 220, the second doped region 222a and the third doped region 216 are also isolated from one another by the STI features 230. In one embodiment, the third doped region 216 may be coupled to a high voltage power supply terminal VDD. The first doped region 220 and the second doped region 222a may be both coupled to a low voltage power supply terminal VSS. For example, as shown in FIG. 2c, the first doped region 220 and the second doped region 222a may be both coupled to a ground terminal GND. The n-type second doped region 222a, the p-type first well region 214, the p-type substrate 201, the n-type second well region 212 and the n-type third doped region 216 of the ESD power clamp device 206a may form a parasitic npn bipolar junction transistor (npn BJT). The n-type second doped region 222a may serve as an emitter of the parasitic npn BJT. The p-type first well region 214 and the p-type substrate 201 may serve as a base of the parasitic npn BJT. And the n-type second well region 212 and the n-type third doped region 216 may serve as a collector of the parasitic npn BJT. For example, when the n-type third doped region 216 is coupled to the high voltage power supply terminal VDD, the first doped region 220 and the second doped region 222a are both coupled to the ground terminal GND. The aforementioned parasitic npn BJT may be with a forward biased emitter-base junction and a reverse biased base-collector junction, that is, the parasitic npn BJT would be in a forward-active mode operation. If the semiconductor device encounters ESD current zapping from the high voltage power supply terminal VDD, the parasitic npn BJT may provide a transmission path from the pads 210 to the substrate 201. Therefore, a high electron injection may be induced from the emitter (the n-type heavily doped (n+) region 222a) to base (the p-type first well region 214 and the p-type substrate 201). Thus, the ESD power clamp device 206a would transmit the ESD transient current and prevent the ESD protection device from over voltage. Additionally, the ESD power clamp device 206a may clamp a power region of the ESD protection device. Meanwhile, the ESD power clamp device 206a may increase noise isolation efficiency of the first guard ring 226a and the second guard ring 228a. Also, because the ESD power clamp device 206a is disposed in the guard ring area 251, integrating with the first guard ring 226a and the second guard ring 228a, the ESD power clamp device does not require additional area. Thus, chip area for ESD protection can be reduced. Meanwhile, a cross section of the ESD power clamp device 206b may be similar to FIG. 2c with the only difference being the replacement of the second doped region 222a with 222b.

Figure 3A:
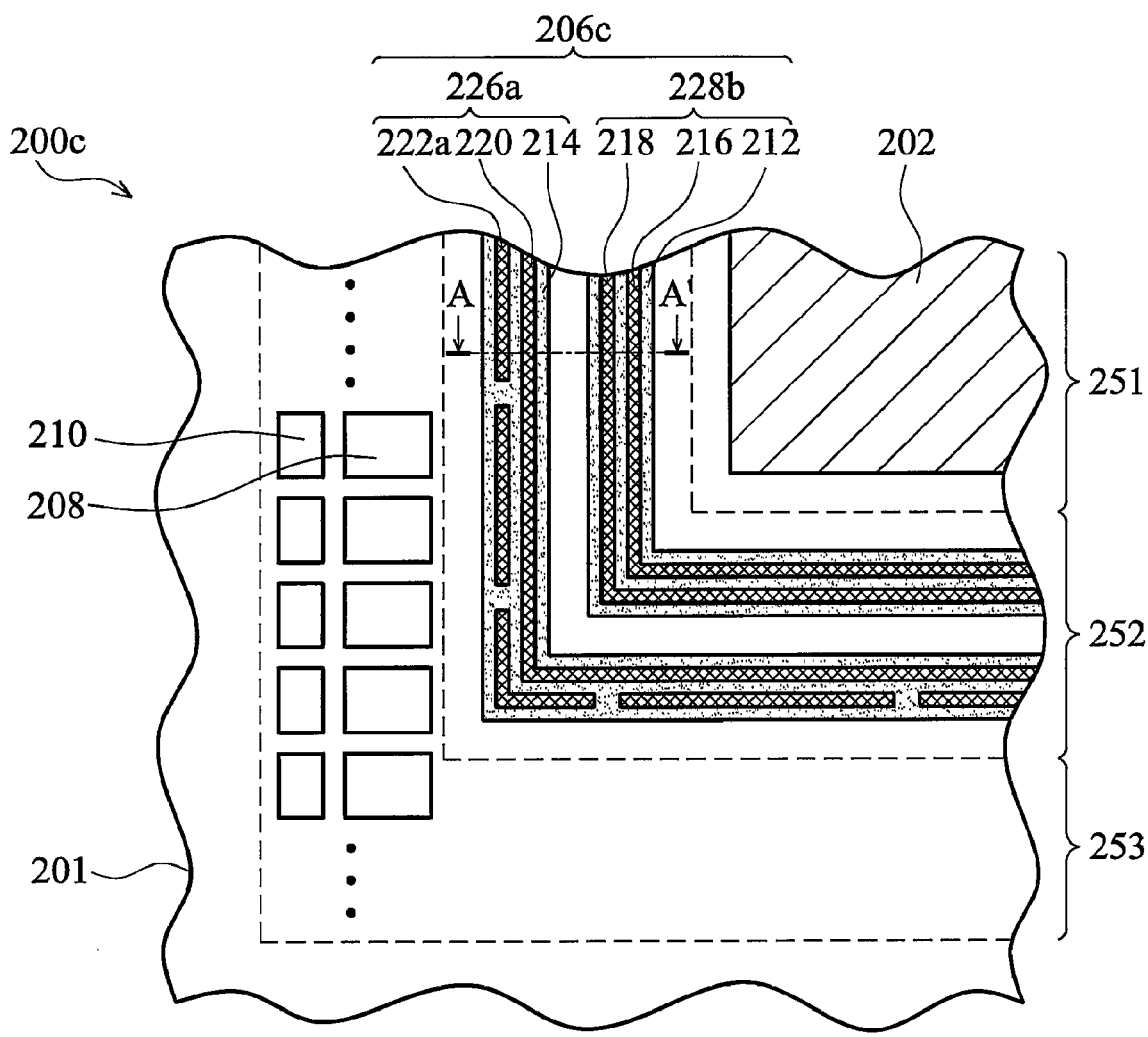
FIGS. 3a and 3b show circuit layout diagrams of a portion of other embodiments of a semiconductor device of the invention.

FIG. 3a shows a circuit layout diagram 200c of a portion of another embodiment of a semiconductor device of the invention, showing a top view of a portion of another embodiment of a semiconductor device of the invention. Elements of this embodiment which are the same as those previously described in FIGS. 2a and 2b, are not repeated for brevity. As shown in FIG. 3a, an ESD power clamp device 206c may comprise an outer first guard ring 226a and an inner second guard ring 228b. The first guard ring 226a may comprise a first well region 214, a first doped region 220 and a second doped region 222a. The second guard ring 228b may comprise a fourth doped region 218. The fourth doped region 218 is in the second well region 212, adjacent to the surface of the substrate 201. As shown in FIG. 3a, the fourth doped region 218 may substantially enclose the protected device 202, and be parallel to the first doped region 220, the second doped region 222a and the third doped region 216. The third doped region 216 and the fourth doped region 218 may be isolated from each other by STI features. The fourth doped region 218 may have a conductive type which is the same as the substrate 201. And the fourth doped region 218 may have an impurity concentration larger than the second well region 212. In this embodiment, the fourth doped region 218 may serve as a p-type heavily dope (p+) region 218.

Figure 3B:
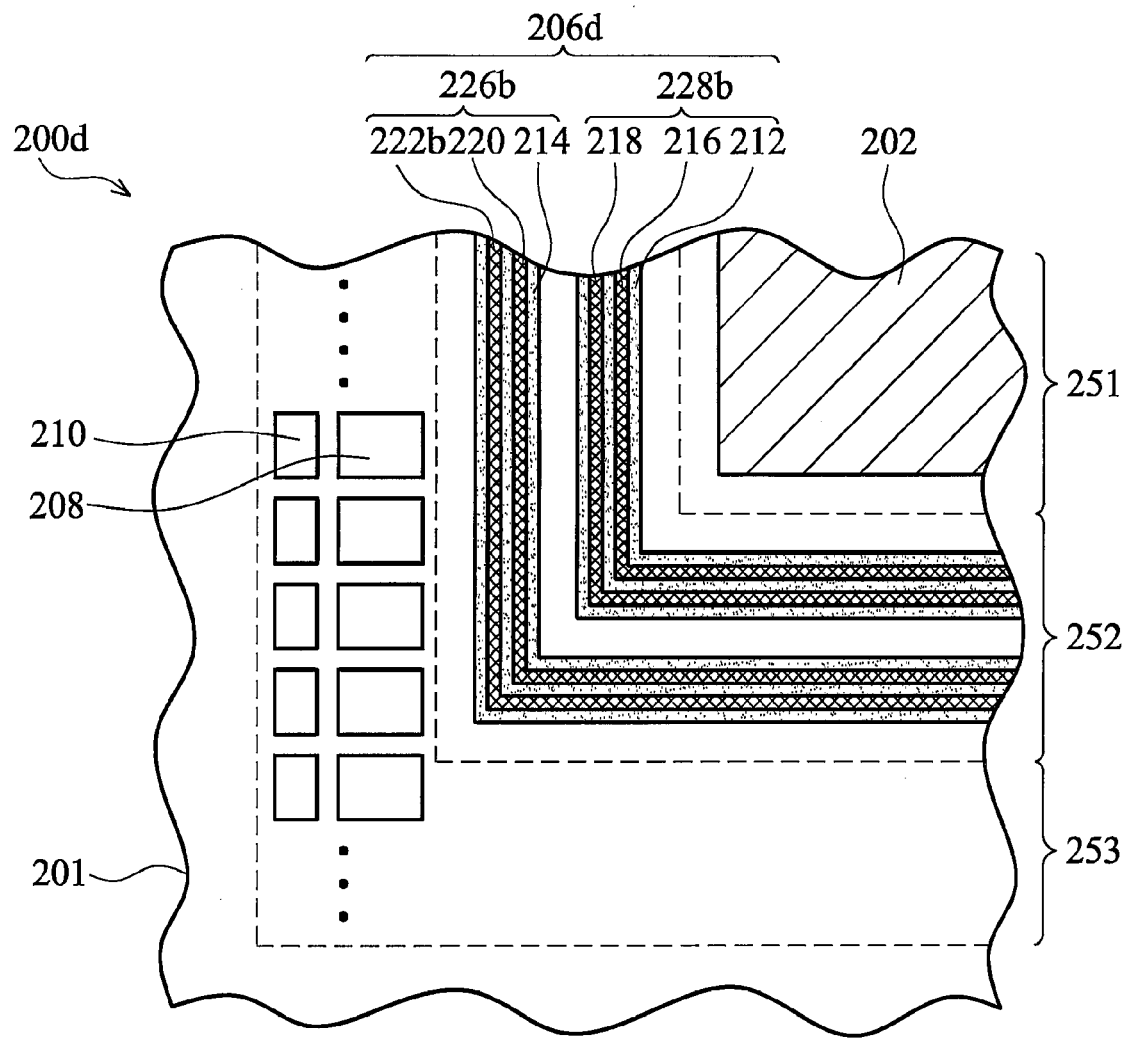

FIG. 3b shows a circuit layout diagram 200d of a portion of another embodiment of a semiconductor device of the invention, showing a top view of a portion of another embodiment of a semiconductor device of the invention. As shown in FIG. 3b, a second doped region 222b of an ESD power clamp device 206d is a continuous doped region.

Figure 3C:
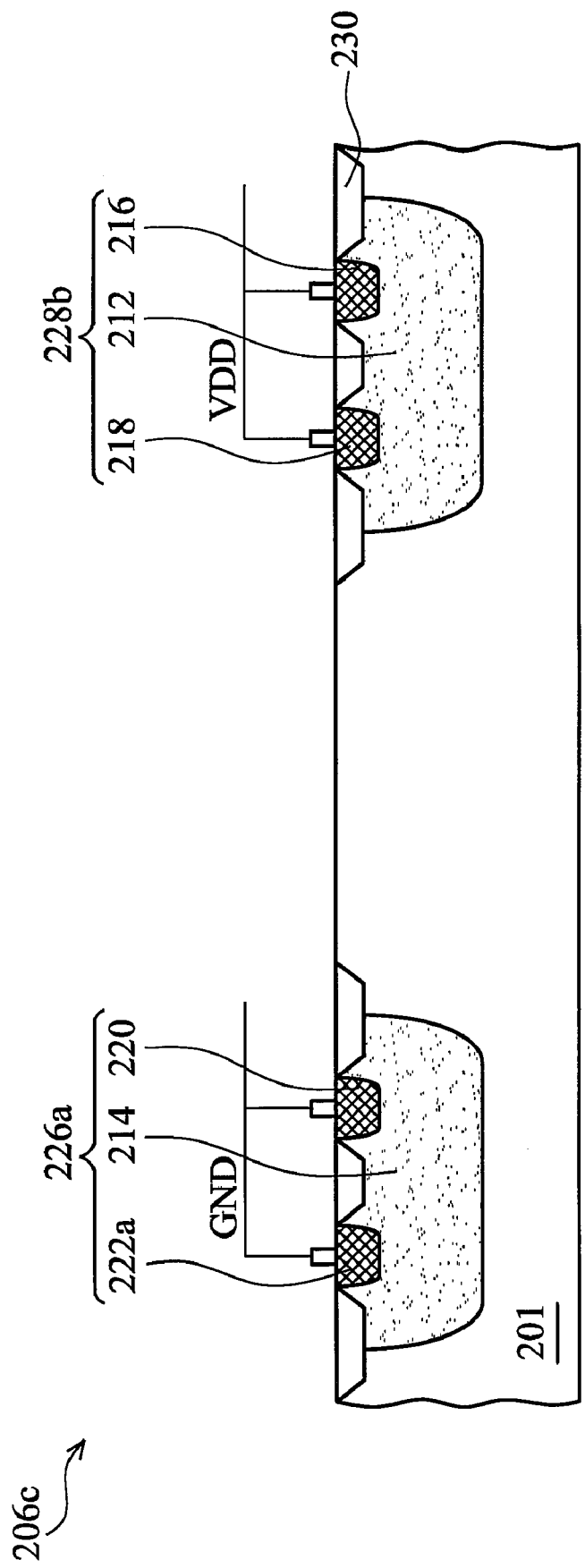

FIG. 3c shows a cross section of the ESD power clamp device 206c. As shown in FIG. 3c, the first well region 214 and the second well region 212 are isolated form each other by the STI features 230. Similarly, the first doped region 220, the second doped region 222a, the third doped region 216 and the fourth doped region 218 are also isolated from one another by the STI features 230. In one embodiment, the third doped region 216 and the fourth doped region 218 may be both coupled to a high voltage power supply terminal VDD. The first doped region 220 and the second doped region 222a may be both coupled to a low voltage power supply terminal VSS. For example, as shown in FIG. 3c, the first doped region 220 and the second doped region 222a are both coupled to a ground terminal GND. In this embodiment, the ESD power clamp device 206c may serve as a parasitic silicon controlled rectifier (SCR). If the semiconductor device encounters ESD current or high voltage power supply terminal VDD current, the parasitic SCR would be triggered to form a transmission path from the high voltage power supply terminal VDD to the ground terminal GND. Therefore, a high hole injection may be induced from the p-type heavily doped (p+) region 216 to the p-type substrate 201 through the n-type well region 212. Next, the high hole injection may be injected to the ground terminal GND through the n-type heavily doped (n+) region 222a in the p-type first well region 214. Thus, the ESD power clamp device 206c would transmit the ESD transient current and prevent the ESD protection device from over voltage. Additionally, the ESD power clamp device 206c may clamp a power region of the ESD protection device. Meanwhile, the ESD power clamp device 206c may increase noise isolation efficiency of the first guard ring 226a and the second guard ring 228b. Also, because the ESD power clamp device 206c may be disposed in the guard ring area 252, integrating with the first guard ring 226a and the second guard ring 228b, the ESD power clamp device does not require additional area. Thus, chip area for ESD protection can be reduced. Meanwhile, a cross section of the ESD power clamp device 206d may be similar to FIG. 3c with the only difference being the replacement of the second doped region 222a with 222b.

An embodiment of an ESD power clamp device of the invention is disposed in the guard ring area, integrating with the guard ring to increase noise isolation efficiency of the guard ring. Additionally, the ESD power clamp device does not require additional area. The chip area can be further reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate having a protected device area, a guard ring area and a periphery device area, wherein the substrate has a conductive first type;
    a protected device in the protected device area;
    an electrostatic discharge power clamp device comprising an outer first guard ring and an inner second guard ring in the guard ring area enclosing the protected device, wherein the first guard ring comprises:
        a first well region having the first conductive type; and
        a first doped region having the first conductive type and a second doped region having a second conductive type in the first well region, adjacent to a surface of the substrate;
    the second guard ring comprises:
        a second well region having the second conductive type; and
        a third doped region having the second conductive type in the second well region, adjacent to the surface of the substrate; and
    an input/output device in the periphery device area, coupled to the electrostatic discharge power clamp device.

2. The semiconductor device as claimed in claim 1, wherein the second guard ring comprise a fourth doped region having the first conductive type in the second well region, adjacent to the surface of the substrate.

3. The semiconductor device as claimed in claim 2, wherein the third and fourth doped regions are both coupled to a high voltage power supply terminal.

4. The semiconductor device as claimed in claim 2, wherein the third and fourth doped regions respectively enclose the protected device and are parallel with each other.

5. The semiconductor device as claimed in claim 1, further comprising:
    an electrostatic discharge protection device coupled to the input/output device and the electrostatic discharge power clamp device.

6. The semiconductor device as claimed in claim 1, wherein the first conductive type is n-type and the second conductive type is p-type.

7. The semiconductor device as claimed in claim 1, wherein the first conductive type is p-type and the second conductive type is n-type.

8. The semiconductor device as claimed in claim 1, wherein the first well region and the second well region are isolated from each other by a shallow trench isolation feature.

9. The semiconductor device as claimed in claim 1, wherein the first doped region and the second doped region are isolated from each other by a shallow trench isolation feature.

10. The semiconductor device as claimed in claim 1, wherein the first and second doped regions respectively enclose the protected device and are parallel with each other.

11. The semiconductor device as claimed in claim 1, wherein the first and second doped regions are both coupled to a ground terminal.

12. The semiconductor device as claimed in claim 1, further comprising:
    a pad coupled to the electrostatic discharge protection device.

13. The semiconductor device as claimed in claim 1, wherein the second doped region, the first well region, the substrate, the second well region and the third doped region are formed as a bipolar junction transistor.

14. The semiconductor device as claimed in claim 1, wherein the electrostatic discharge power clamp device is coupled to the protected device and the input/output device.

15. The semiconductor device as claimed in claim 1, further comprising:
   a pad coupled to the electrostatic discharge protection device.

16. A semiconductor device, comprising:
   a p-type substrate having a protected device area, a guard ring area and a periphery device area;
   a protected device in the protected device area;
   an electrostatic discharge power clamp device comprising an outer first guard ring and an inner second guard ring in the guard ring area enclosing the protected device, wherein the first guard ring comprises:
      an n-type well region; and
      a first n-type heavily doped region and a first p-type heavily doped region in the n-type well region, adjacent to a surface of the p-type substrate;
   the second guard ring comprises:
      a p-type well region; and
      a second p-type heavily doped region in the p-type well region, adjacent to the surface of the p-type substrate; and
   an input/output device in the periphery device area, coupled to the electrostatic discharge power clamp device, wherein the second guard ring comprises a second n-type heavily doped region in the p-type well region, adjacent to the surface of the p-type substrate, wherein the second n-type heavily doped region and the second p-type heavily doped region respectively enclose the protected device and are parallel with each other.

17. The semiconductor device as claimed in claim 16, wherein the second n-type heavily doped region and the second p-type heavily doped region are both coupled to a high voltage power supply terminal.

18. The semiconductor device as claimed in claim 16, further comprising:
   an electrostatic discharge protection device coupled to the input/output device and the electrostatic discharge power clamp device.

19. The semiconductor device as claimed in claim 16, wherein the n-type well region and the p-type well region are isolated from each other by a shallow trench isolation feature.

20. The semiconductor device as claimed in claim 16, wherein the first n-type heavily doped region and the first p-type heavily doped region are isolated from each other by a shallow trench isolation feature.

21. The semiconductor device as claimed in claim 16, wherein the first n-type heavily doped region and the first p-type heavily doped region respectively enclose the protected device and are parallel with each other.

22. The semiconductor device as claimed in claim 16, wherein the first n-type heavily doped region and the first p-type heavily doped region are both coupled to a ground terminal.

23. The semiconductor device as claimed in claim 16, wherein the first n-type heavily doped region, the p-type well region, the p-type substrate, the n-type well region and the second n-type heavily doped region are formed as a bipolar junction transistor.

24. The semiconductor device as claimed in claim 16, wherein the electrostatic discharge power clamp device is coupled to the protected device and the input/output device.

* * * * *